US011675087B2

(12) United States Patent
Vosburgh

(10) Patent No.: US 11,675,087 B2
(45) Date of Patent: Jun. 13, 2023

(54) MAGNETIC VELOCITY AND POSITION SENSORS

(71) Applicant: Archaius LLC, Durham, NC (US)

(72) Inventor: Frederick Vosburgh, Durham, NC (US)

(73) Assignee: ARCHAIUS LLC, Durham, NC (US)

( * ) Notice: Subject to any disclaimer, the term of this patent is extended or adjusted under 35 U.S.C. 154(b) by 0 days.

(21) Appl. No.: 17/776,488

(22) PCT Filed: Jan. 8, 2021

(86) PCT No.: PCT/US2021/012811
§ 371 (c)(1),
(2) Date: May 12, 2022

(87) PCT Pub. No.: WO2021/146120
PCT Pub. Date: Jul. 22, 2021

(65) Prior Publication Data
US 2022/0404508 A1    Dec. 22, 2022

Related U.S. Application Data

(60) Provisional application No. 63/117,612, filed on Nov. 24, 2020, provisional application No. 63/094,161, (Continued)

(51) Int. Cl.
*G01S 19/21* (2010.01)
*G01S 19/45* (2010.01)

(52) U.S. Cl.
CPC ............ *G01S 19/215* (2013.01); *G01S 19/45* (2013.01)

(58) Field of Classification Search
CPC .......... G01S 19/00; G01S 19/01; G01S 19/13; G01S 19/21; G01S 19/215; G01S 19/38;
(Continued)

(56) References Cited

U.S. PATENT DOCUMENTS 4,751,512 A   6/1988 Longaker
6,760,664 B1  7/2004 Julie et al.
(Continued)

FOREIGN PATENT DOCUMENTS

JP    2000028367 A    1/2000
JP    2001021415 A  * 1/2001    ............... G01J 3/51

OTHER PUBLICATIONS

International Search Report and Written Opinion dated May 24, 2021 issued by the United States Patent and Trademark Office as International Searching Authority in connection with International Application No. PCT/US2021/012811 (11 pages).

(Continued)

*Primary Examiner* — Hoai-An D. Nguyen
(74) *Attorney, Agent, or Firm* — Neo IP

(57) ABSTRACT

A system includes at least one sensing unit, the sensing unit including a sensing element. The system includes at least one spatial Lorentz filter coupled to the sensing element. The spatial Lorentz filter (SLF) includes an input coupled to the sensing element and an analog to digital converter (ADC) providing a filtered output signal. The sensing unit is connected to a processor configured for determining velocity or position with respect to a magnetic field and/or a geographic position by processing SLF output signals.

22 Claims, 10 Drawing Sheets

Related U.S. Application Data filed on Oct. 20, 2020, provisional application No. 63/021,637, filed on May 7, 2020, provisional application No. 62/960,175, filed on Jan. 13, 2020.

(58) Field of Classification Search
CPC .......... G01S 19/39; G01S 19/42; G01S 19/45; G01C 21/00; G01C 21/04; G01C 21/08; G01V 3/00; G01V 3/40
USPC .......................................................... 324/200
See application file for complete search history.

(56) References Cited

U.S. PATENT DOCUMENTS

| | | | |
|---|---|---|---|
| 6,900,760 B2 | 5/2005 | Groves | |
| 7,208,939 B2* | 4/2007 | Frederick | G01D 5/145 324/207.2 |
| 7,231,325 B2* | 6/2007 | Motz | G01D 5/145 73/514.31 |
| 8,311,767 B1 | 11/2012 | Stetson | |
| 8,666,347 B2 | 3/2014 | Wilkerson et al. | |
| 8,965,319 B2 | 2/2015 | Wilkerson et al. | |
| 9,042,857 B2 | 5/2015 | Vosburgh et al. | |
| 9,203,461 B2 | 12/2015 | Vosburgh et al. | |
| 9,350,401 B2 | 5/2016 | Wilkerson | |
| 9,450,625 B2 | 9/2016 | Vosburgh et al. | |
| 9,519,062 B2 | 12/2016 | Vosburgh et al. | |
| 9,653,003 B2 | 5/2017 | Laine et al. | |
| 9,735,758 B2 | 8/2017 | Wilkerson | |
| 9,753,126 B2 | 9/2017 | Smits | |
| 9,760,806 B1 | 9/2017 | Ning et al. | |
| 9,863,773 B2 | 1/2018 | Jiang et al. | |
| 9,866,267 B2 | 1/2018 | Vosburgh | |
| 9,927,530 B2 | 3/2018 | Boyarski | |
| 9,977,113 B2 | 5/2018 | Dehghanian et al. | |
| 10,054,445 B2 | 8/2018 | Ma | |
| 10,648,814 B2 | 5/2020 | Hardt et al. | |
| 2007/0067128 A1 | 3/2007 | Vock et al. | |
| 2015/0106008 A1 | 4/2015 | Hernandez et al. | |
| 2017/0048439 A1 | 2/2017 | Borcke-Morawitz et al. | |

OTHER PUBLICATIONS

Mount, L. (2018). Navigation using vector and tensor measurements of the earth's magnetic anomaly field (thesis). AFIT-ENG-MS-18-M-049 Air Force Institute of Technology, Wright-Patterson Air Force Base, Ohio.

\* cited by examiner

US 11,675,087 B2

MAGNETIC VELOCITY AND POSITION SENSORS

PRIORITY CLAIM

This application is a National Stage Entry, filed under 35 U.S.C. § 371, of International Patent Application No. PCT/US2021/012811, filed Jul. 22, 2021, which claims the benefit of U.S. Provisional Patent Application Ser. No. 62/960,175, filed Jan. 13, 2020, U.S. Provisional Patent Application Ser. No. 63/021,637, filed May 7, 2020, U.S. Provisional Patent Application Ser. No. 63/094,161, filed Oct. 20, 2020, and U.S. Provisional Patent Application Ser. No. 63/117,612, filed Nov. 24, 2020, each of which is incorporated herein by reference in its entirety.

TECHNICAL FIELD

The subject matter described herein relates generally to navigation sensors and to determining displacement and position in a magnetic field.

BACKGROUND

Faraday (1831), Hall (1879) and Lorentz (1895), among others, described electric effects of magnetic fields, e.g. charge separation and current deflection, which can be shown to be proportional to charge velocity in a magnetic field. Although widely inferred from Einstein (1906) to be impossible, the local measurement of velocity through the geomagnetic field would have utility as an aid to navigation, particularly in the absence of GPS.

SUMMARY

In light of this, we disclose Magnetic Velocity and Position (MVP) sensors for local measurement of velocity with respect to the geomagnetic field and, thereby, over ground using the geomagnetic field as the frame of reference and without requiring prior knowledge of that field.

A system includes at least one sensing unit, the sensing unit including a sensing element. The sensing unit includes at least one spatial Lorentz filter (SLF) coupled to the sensing element. SLF includes a connection coupled to the sensing element and an analog to digital converter (ADC) providing a digital filtered via an output connector. SLF also comprises a signal condition circuit providing at least one of amplitude gain and frequency selection. The sensing unit is connected to a processor configured for determining velocity or position with respect to a magnetic field and/or a geographic position by processing SLF output signals.

The computer processing elements described herein can be implemented in software in combination with hardware and/or firmware. For example, the subject matter described herein can be implemented in software executed by a processor. In one example implementation, the subject matter described herein may be implemented using a computer readable medium having stored thereon computer executable instructions that when executed by the processor of a computer control the computer to perform steps. Example computer readable media suitable for implementing the subject matter described herein include non-transitory devices, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

DETAILED DESCRIPTION

This specification describes sensors that measure velocity through the Earth's magnetic field and, thereby, over ground. A system using the sensor can determine current geographic position by detecting, isolating, and measuring velocity signals induced by the Lorentz force acting on the sensor due to motion through the field. The sensor has at least one sensing unit incorporating a sensing element coupled to at least one SLF the output of which is connected to a digital processor. Signals from at least one sensing unit are processed to determine a velocity vector of desirable dimension. The processor integrates velocity over time to determine changes in position, which is added to a prior position to determine current position.

Examples of use of the system in addition to navigation include mapping environmental parameters such as the magnetic field, water currents or winds, air or water quality, and dynamic electromagnetic signals such as sources of light or radio signals.

Figure 1:
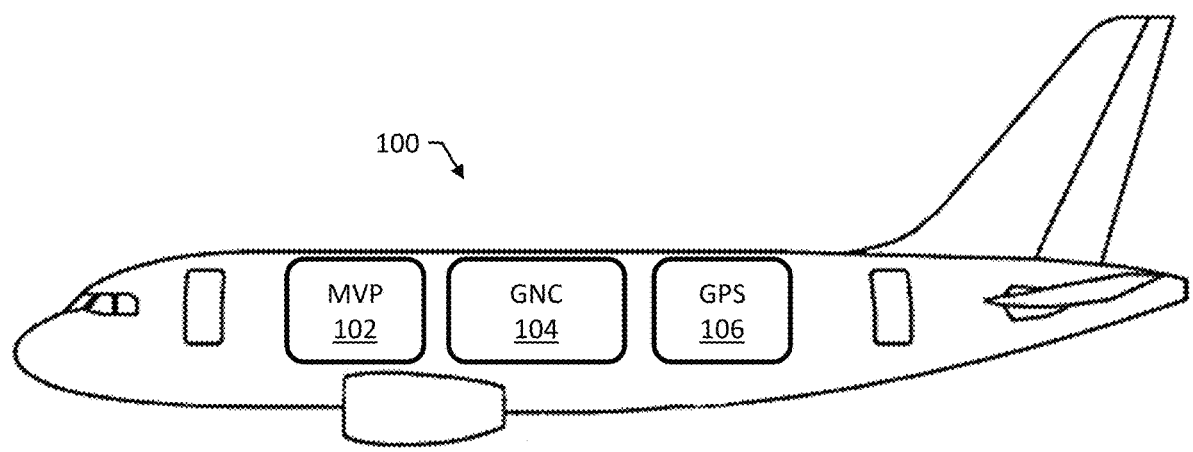
FIG. 1 is a block diagram of a vehicle using a magnetic velocity and/or position (MVP) sensor system to navigate.

FIG. 1 is a block diagram of a vehicle 100 using a magnetic velocity and/or position (MVP) sensor system 102 to navigate. The vehicle 100 includes a guidance and navigation controller (GNC) 104 that can be used to track the position of the vehicle 100 and, in some examples, to autonomously or semi-autonomously control the vehicle 100. The GNC 104 can receive velocity and/or position information from the system 102.

In some examples, the vehicle includes a global positioning system (GPS) system 106. The GNC 104 can use the GPS system 106 to determine the position of the vehicle 100 and then use sensor 102 to track changes in the position of the vehicle 100 over time. This can be useful, for example, where the GPS system 106 is subject to spoofing. The system 102 can continue to track the position of the vehicle 100 even though the GPS system 106 has failed. Comparing positions determined by system 102 and GPS 106, for example by the GNC, can be used to detect spoofing The system 102 is configured to measure velocity through the Earth's magnetic field. A charge moving through a magnetic field experiences a Lorentz force which can displace the charge in linear proportion to velocity. However, in some conventional systems, local measurement of that deflection and, thereby, velocity is impossible because of adverse field effects.

The system 102 performs velocity measurement using spatial Lorentz filters (SLF) to isolate velocity indicative signals induced by movement with respect to the Earth's magnetic field. Velocity is integrated over time to update a previous measurement of position. In addition to supporting accurate navigation in the absence of GPS or other reference signals, the present invention can also support mapping of environmental parameters, e.g. field strength, signal sources or topography.

Figure 2:
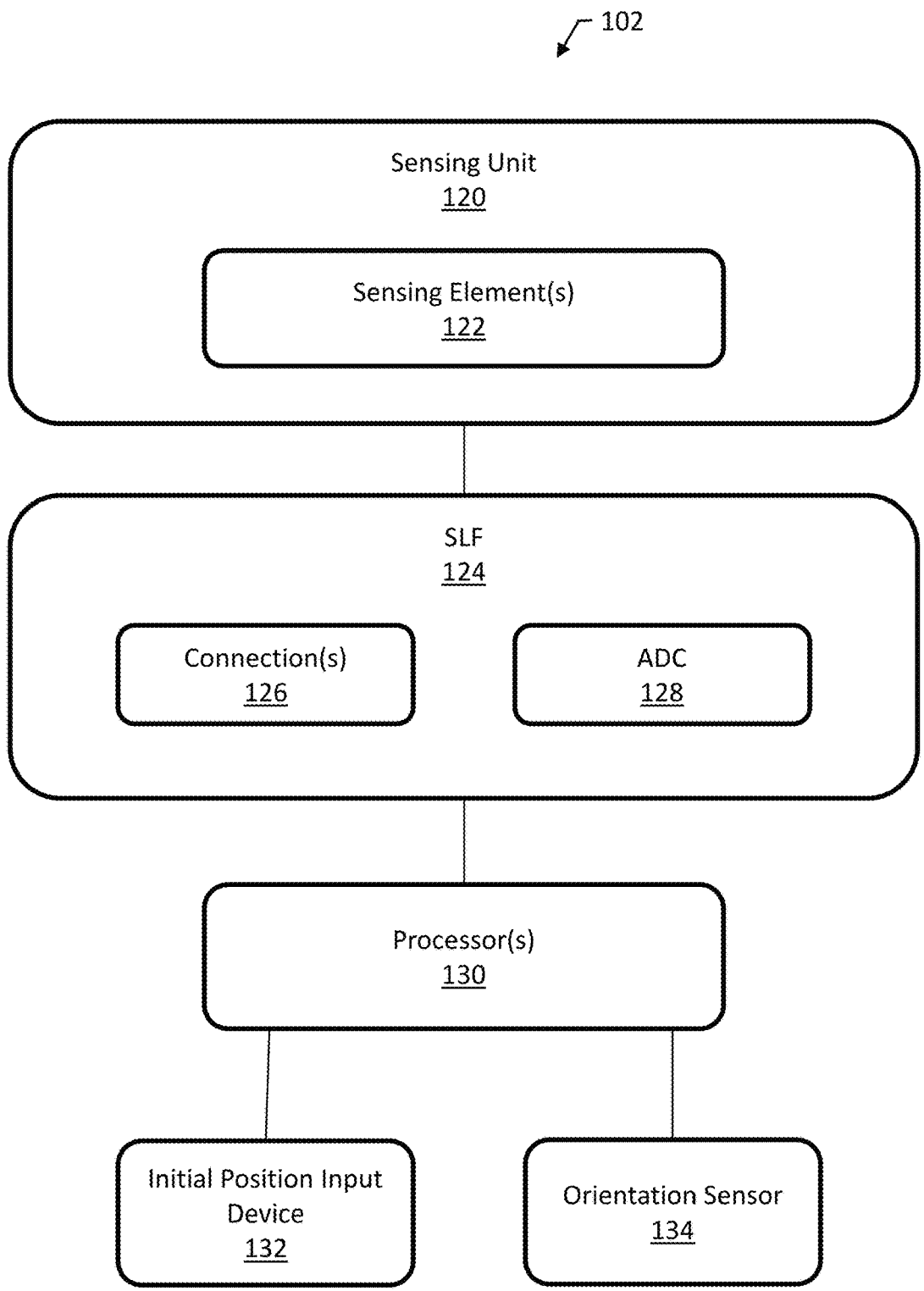
FIG. 2 is block diagram of an example system for magnetic velocity and/or position measurement.

FIG. 2 is block diagram of an example magnetic velocity and position (MVP) sensor system 102. The system 102 includes at least one sensing unit 120. The sensing unit 120 includes one or more sensing elements 122.

The sensing element 122 comprises at least one type of a conductor and semiconductor. In some examples, the sensing element 122 comprises one or more layered materials, for example, Giant, Tunneling and Anisotropic Magneto-Resistive materials (GMR, TMR, and AMR) or graphene. In some cases, these materials can be more sensitive than a homogenous semiconductor layer. The sensing element 122 can be formed in any appropriate shape, e.g., as a circular disc, a slab, or deposit or filament.

The system 102 includes at least one SLF 124 coupled to the sensing element 122. The SLF 124 includes a connection 126 (e.g., a pickup or other input type) coupled to the sensing element 122 (e.g., one pickup for each end of the sensing element in the case where there is more than one pickup). The connection 126 can be, e.g., a non-contact (e.g., eddy current pickup) type or a capacitor or a switch among others. In some examples, the connection 126 is made by soldering or any other appropriate electrical connection.

The SLF 124 includes an analog to digital converter (ADC) 128 providing a digital type filtered output signal. ADC 128 receives an analog signal from the connection 126, and may be is subject to adverse field effects between the connection 126 and the ADC 128. For this reason, SLF is reduced in size and oriented to minimize such effects. ADC 128 then provides output signals of digital type not readily corrupted by adverse field effects acting on conductors between SLF 124 and a system processor 130. The processor 130 is any type that can determine velocity or position with respect to a magnetic field and/or a geographic position by processing the output signal from the ADC 128 velocity being determined in one, two, or three dimensions and position being determined with respect to the field or a prior position or a geographic position. In some cases, an initial position input device 132 or an orientation sensor 134 is attached to the processor 130. Input device 132 can be any type such as a GPS receiver, celestial, RF or visual triangulation device or a keypad. Orientation device 134 can comprise any type such as compass, heading, local field or tilt sensor.

Figure 3A:
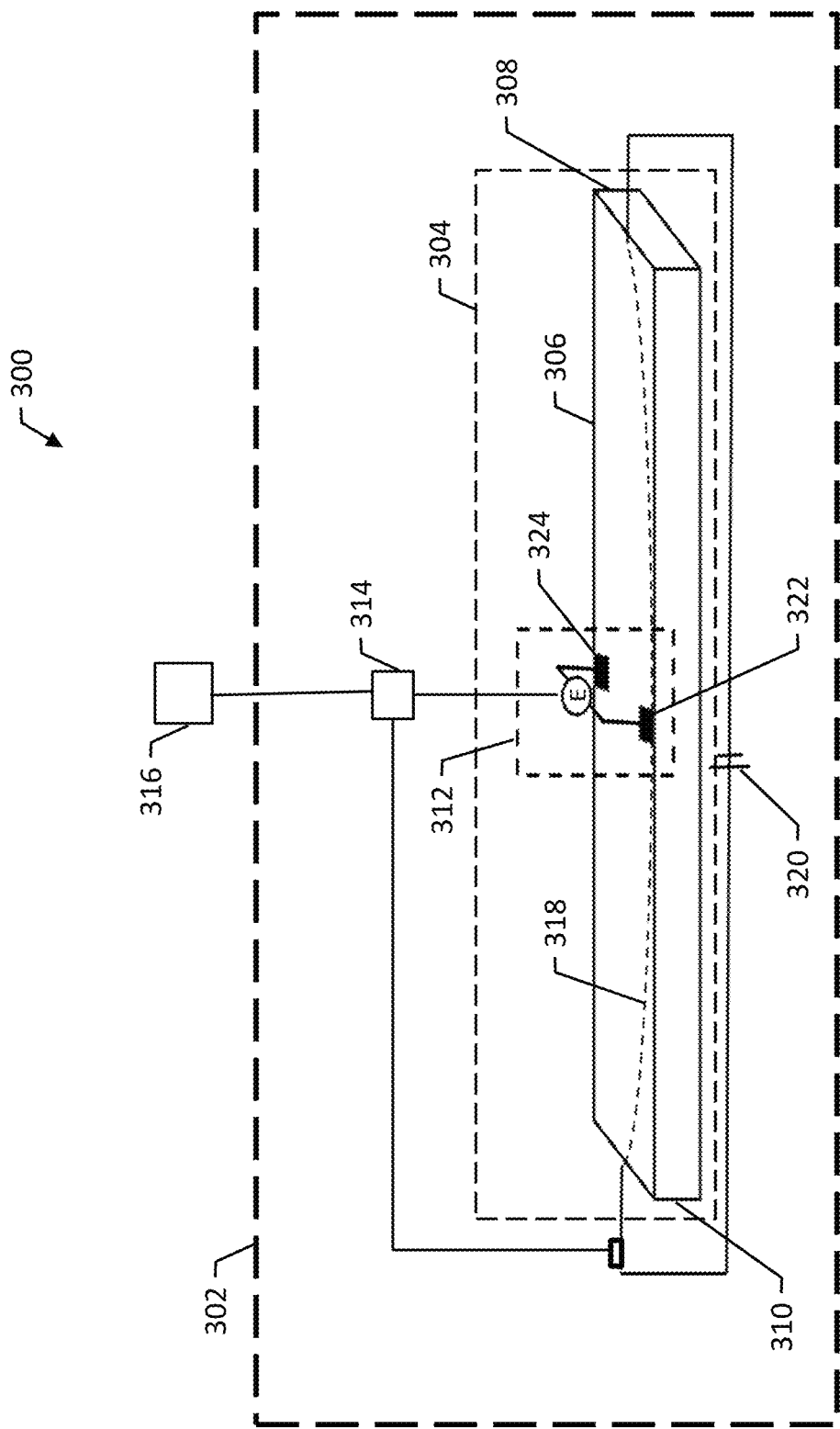
FIG. 3A is a block diagram of an example system for magnetic sensing of velocity and/or position using the Hall Effect.

FIG. 3A is a diagram of a sensing unit 304 comprising a sensing element 122 formed of conducting or semiconducting or layered material for carrying a current 318 between a first end 310 and a second end 308 of the sensing element 306. The sensing unit 304 comprises an SLF 312 of any type that can detect a potential due to Lorentz force induced deflection of a current 318.

SLF 312 is connected between a first side 322 and a second side 324 of the sensing element 306 and is preferably oriented orthogonal to the sensing element 306 for minimizing coupling of SLF 312 with the magnetic field. In some cases, SLF 312 is orientable and can be re-oriented to minimize coupling of the field to SLF. The connection of SLF 312 to the sensing element 306 preferably is mid-way between first end 310 and second end 308, i.e. where current deflection is greatest. In some cases, SLF 312 comprises a potential measuring type, such as a volt meter preferably having a digital output or with a connection to an ADC.

Figure 3B:
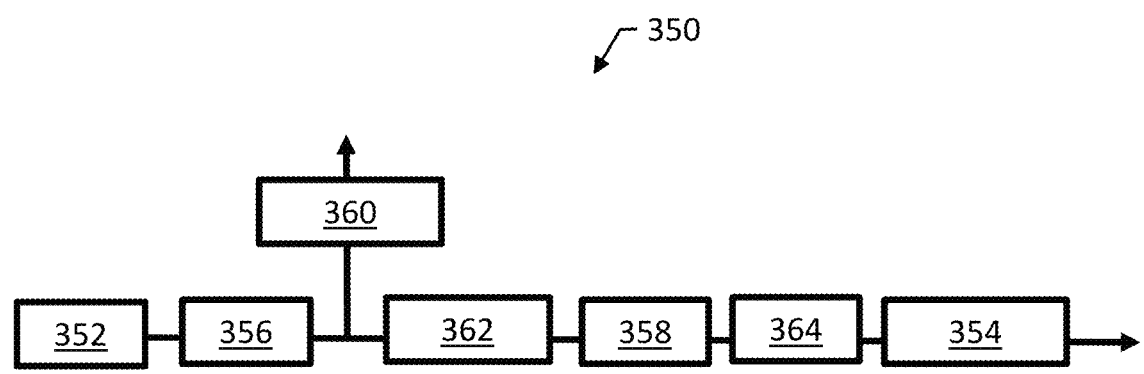
FIG. 3B is a diagram of the SLF providing digital output signals to the processor.

FIG. 3B is a diagram of an SLF 350 comprising a connecting input 352 and an output 354 between which is connected an analog to digital converter ADC 358. SLF 350 is of a size and/or orientation to the field that minimizes coupling of the field with SLF 350.

SLF 350 comprises a signal conditioner 356 connected between the input 352 and the ADC 358. The signal conditioner 356 can be of any type, e.g. frequency-selecting or amplifying or both.

SLF 350 can include a signal-to-noise reducer SNRr 362 e.g. of amplitude attenuating or noise providing type connected between the signal conditioner 356 and the ADC 358. SLF 350 can include a dynamic range reducer DRr 364, e.g. an averaging or decimation filter, connected between the ADC 358 and the output 354. SNRr 362 and/or DRr 364 are of adjustable type although this is not required. SLF 350 comprises an analog output 360 connectable to another object, e.g. a voltmeter or the system processor.

Figure 4:
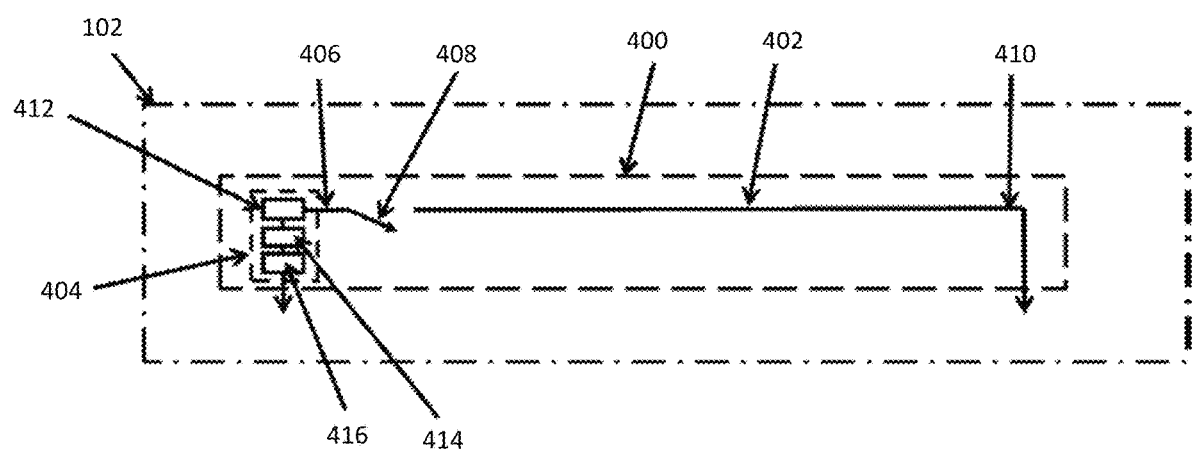
FIG. 4 is a block diagram of an example sensing unit for the system.

FIG. 4 is a block diagram of an example sensing unit 400 for the system 102. The sensing unit 400 includes a sensing element 402. The sensing element 402 is made of any conducting or semiconducting material of any geometry, e.g., circular disc, slab, or filament. The sensing element 402 is mounted in a fixed or rotatable orientation.

The sensing element 402 includes a first end 406 which can include a switch 408. The sensing element 402 includes a second end 410 having a distance from first end 406 according a desirable end-end charge gradient, or potential induced by a Lorentz force created by movement of the sensing element with respect to the Earth's magnetic field. The element 402 functions as a capacitor, charge being retained at the first and second ends 406 and 410 during rotation by opening switch 408. The second end 410 can include a ground connection of fixed or rotation-permitting type, e.g. to permit the sensing element 402 to reorient between a coupling orientation and a non-coupling orientation.

The sensing element 402 is coupled to at least one SLF 404. The SLF 404 includes a pickup 412 coupled to a signal conditioner 414. The output of the signal conditioner 414 is coupled to an ADC 416. The ADC 416 provides a filtered output signal which is proportional to a velocity measurement.

Figure 5:
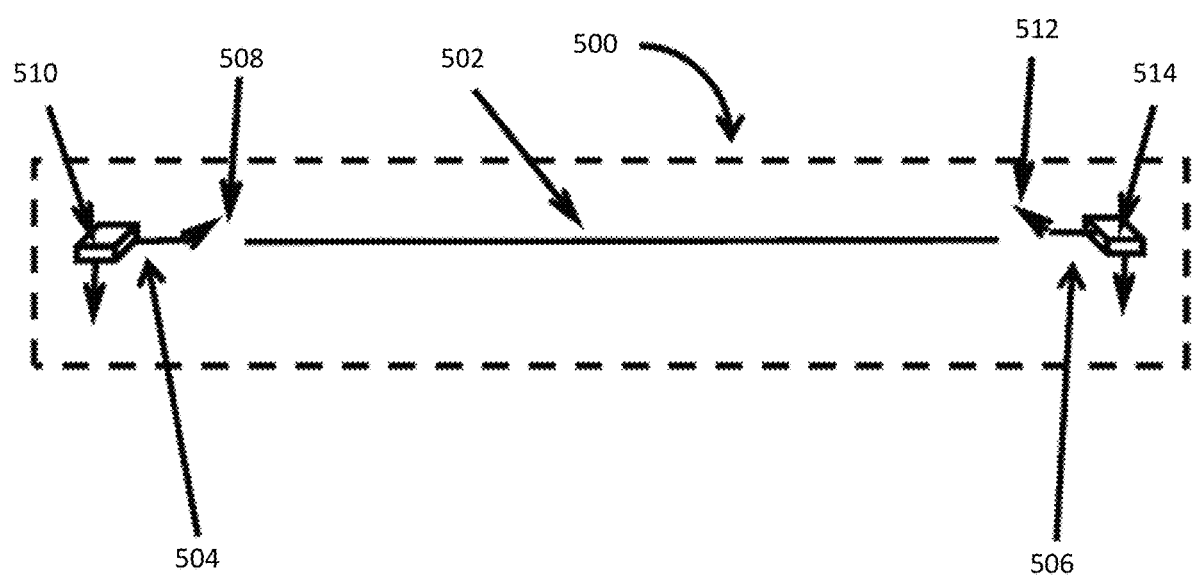
FIG. 5 shows another example of a sensing unit.

FIG. 5 is a diagram of another example of a sensing unit 500. The sensing unit 500 includes a sensing element 502 and two SLFs 510 and 514, one at each end of the sensing element 502. The first SLF 510 includes an input 508, which can be of switchable type. Second SLF includes a second input 512 which can be of switchable type. Inputs 508, 512 can be of any charge retaining type, such as a switchable capacitor.

The SLFs 510, 514 can, in some cases, be reoriented with respect to the magnetic field, either separately or together with a re-orientable sensing element 502. The spatial extent and/or the orientation of SLFs 510 and 514 are selected to minimize exposure to a Lorentz force, i.e. by shrinking and orienting in the direction of travel. The first SLF 504 is electrically isolated from second SLF 506, e.g. by being connected to a separate ground or other ground loop avoidance. It will be understood by those versed in the art that a re-orientable sensing element 502 comprises an enhancement of the rotating disk sensor described in U.S. Pat. No. 9,243,915, which is hereby incorporated by reference in its entirety.

Figure 6:
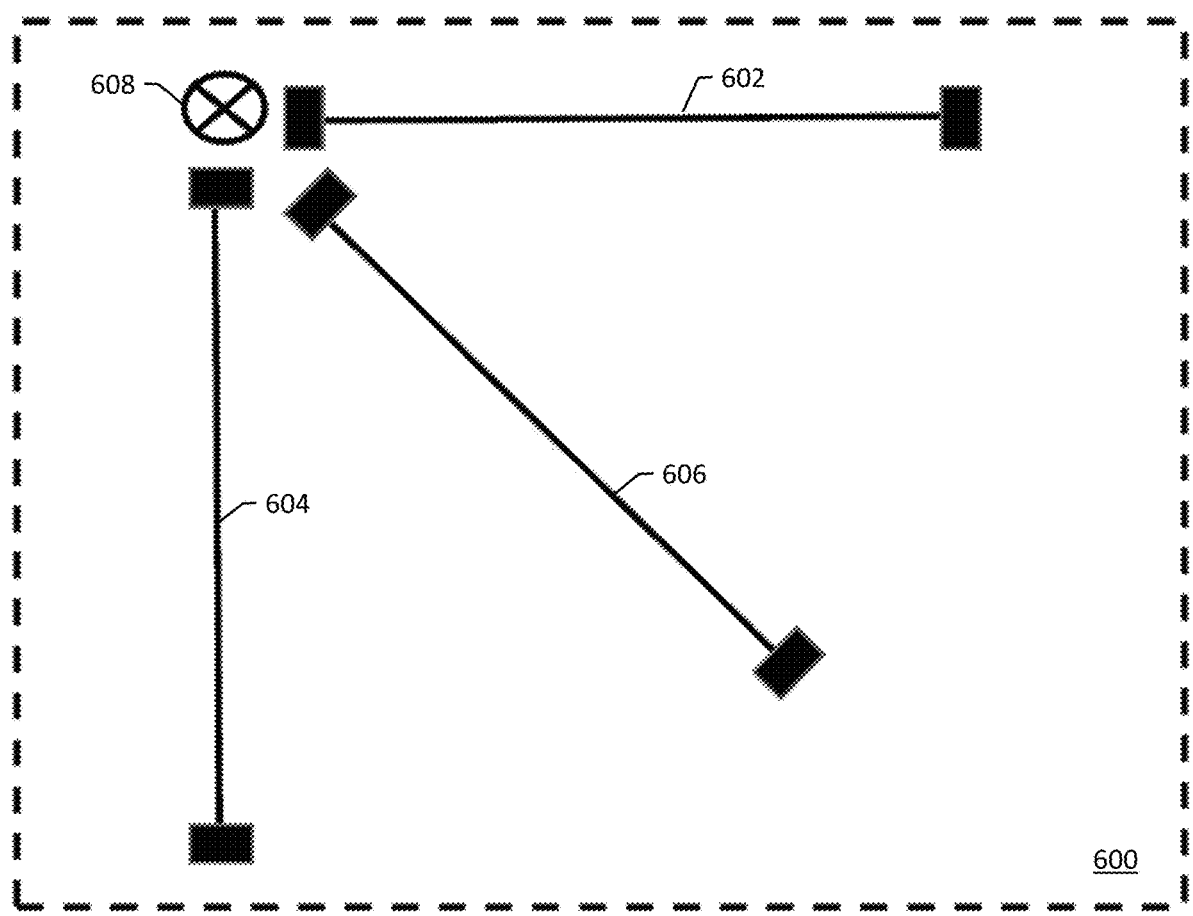
FIG. 6 shows another example of a sensor including a number of sensing units arranged for measuring velocity in two or more dimensions.

FIG. 6 shows an example system 600 including a plurality of non-parallel sensing units 602, 604, 606, 608 in an array configuration that can provide to the processor a plurality of signals for co-processing to provide enhanced determinations of velocity and/or position. In some cases, the array includes supernumerary sensing units for enhanced resolving of velocity components.

Figure 7:
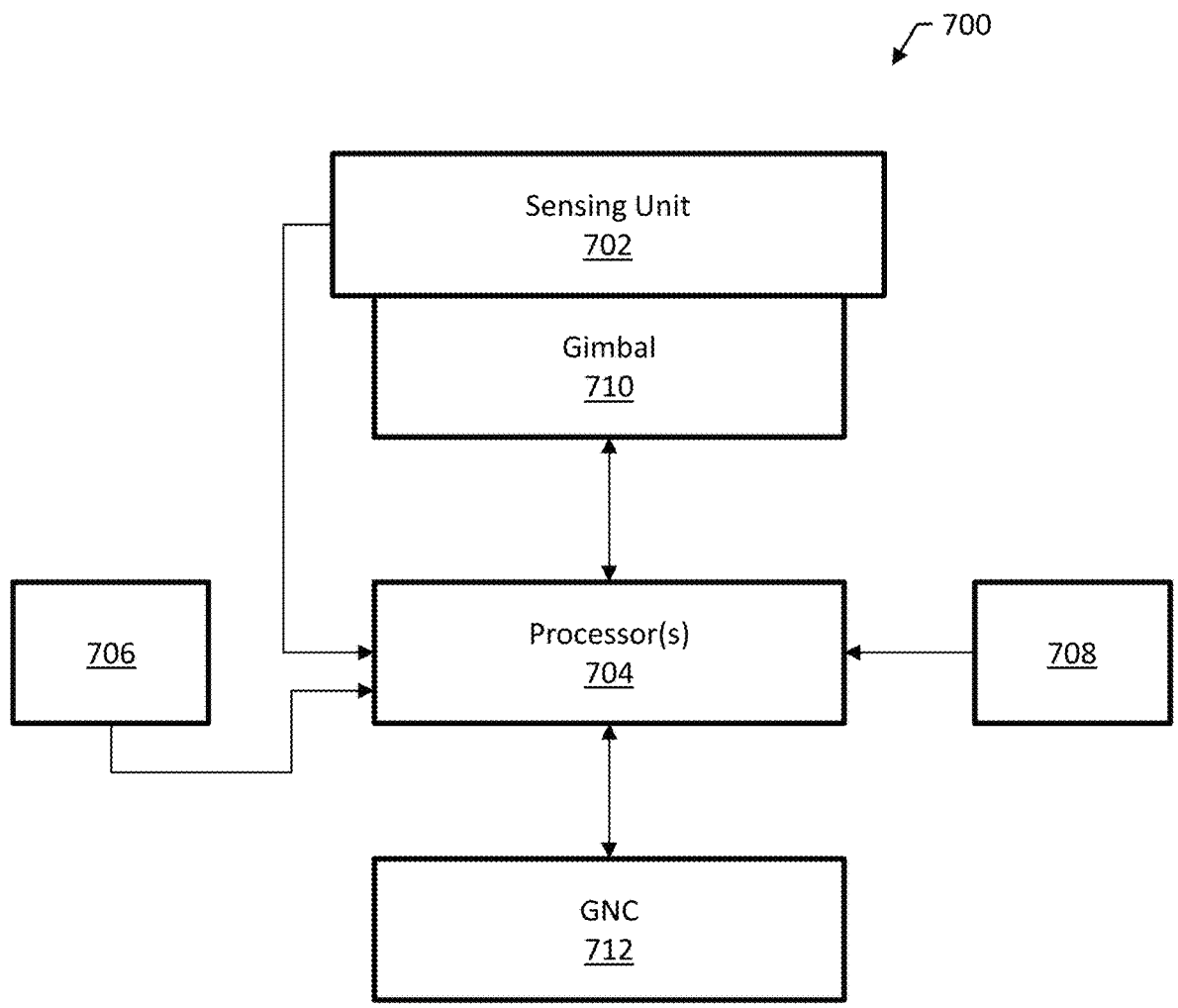
FIG. 7 is a block diagram of an example sensor system configured for orienting a sensing unit with respect to a local magnetic field.

FIG. 7 is a block diagram of an example system 700 that has a magnetometer 706 and/or a tilt sensor 708 connected to a processor 704 to indicate orientation of at least one sensing unit 702 with respect to the magnetic field and/or to the surface of the Earth for normalizing velocity with respect to the local magnetic field by any methods, for example Eq. 1;

$$V_n = kE/B \qquad \text{Eq. 1}$$

where $V_n$ is field-normalized velocity, k is a constant, E is amplitude of an SLF output signal and B is a concurrent measure of the local magnetic field. Velocity is normalized for tilt of the sensor relative to gravity by any method such as by Eq. 2;

$$V_t = V \cos \theta \qquad \text{Eq. 2}$$

where θ is sensing element orientation to the Earth's surface. Velocity over ground can be calculated by normalizing SLF output signal for both the local field and the sensor tilt. It will be appreciated by those versed in the art that normalizing can be conducted by a processor 704, or an external device such as a GNC system.

The system 700 can include a gimbal configured to orient the sensor 702, e.g., based on feedback from the magnetometer 706 and/or tilt sensor 708, for orienting sensor 702 with respect to the field. The processor 704 is any type that can determine a current orientation, a desirable orientation and an orientation difference. The processor 704 is any type that can adjust velocity to compensate for orientation difference.

The processor 704 is any type that can integrate velocity over time to determine a change in position and/or to combine change in position with a prior position, such as one stored in memory, to determine a current position.

Figure 8:
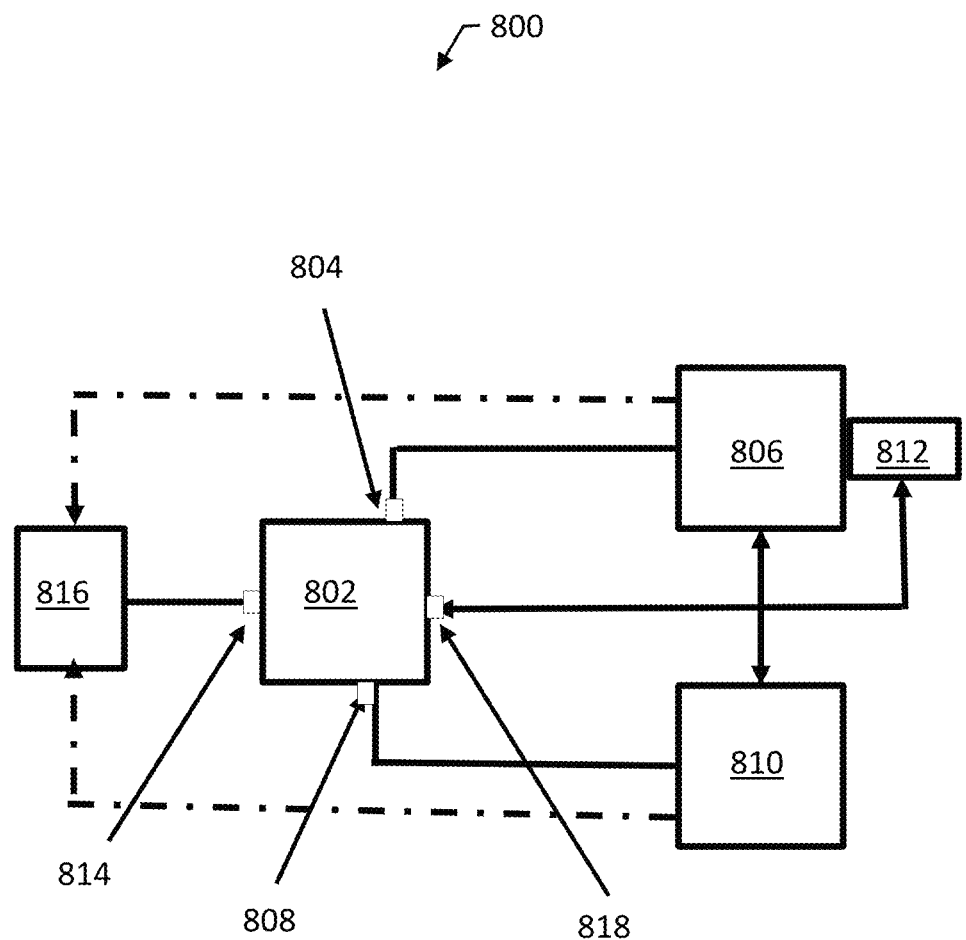
FIG. 8 is a block diagram of an example system configured to detect GPS spoofing.

FIG. 8 is a block diagram of an example system 800 configured to detect GPS spoofing. The system 800 comprises at least one sensing unit 810 connected to a system processor 802 by a first processor input 808 and a GPS receiver 806 connected to processor 802 by a second processor input 804. The processor 802 can be connected to an external device 816, e.g. a GNC.

The processor 802 is any type that can compare to a threshold the difference between a geographic position provided by sensing unit 810 and a GPS position provided by GSP receiver 806, and issuing an alarm when this difference exceeds a threshold. Those versed in the art will appreciate a position provided by a GPS receiver 806 can be used to provide an initial geographic position or to adjust current position for accumulated sensor error. GPS receiver 806 can include an anti-jamming antenna 812 to provide enhanced reception.

The sensing unit 810 and/or the GPS receiver 806 can be connected directly to the external device 816 such as a GNC, as indicated by the dotted connection lines. External device 816 is any type that can compare position determinations to detect GPS spoofing.

Figure 9:
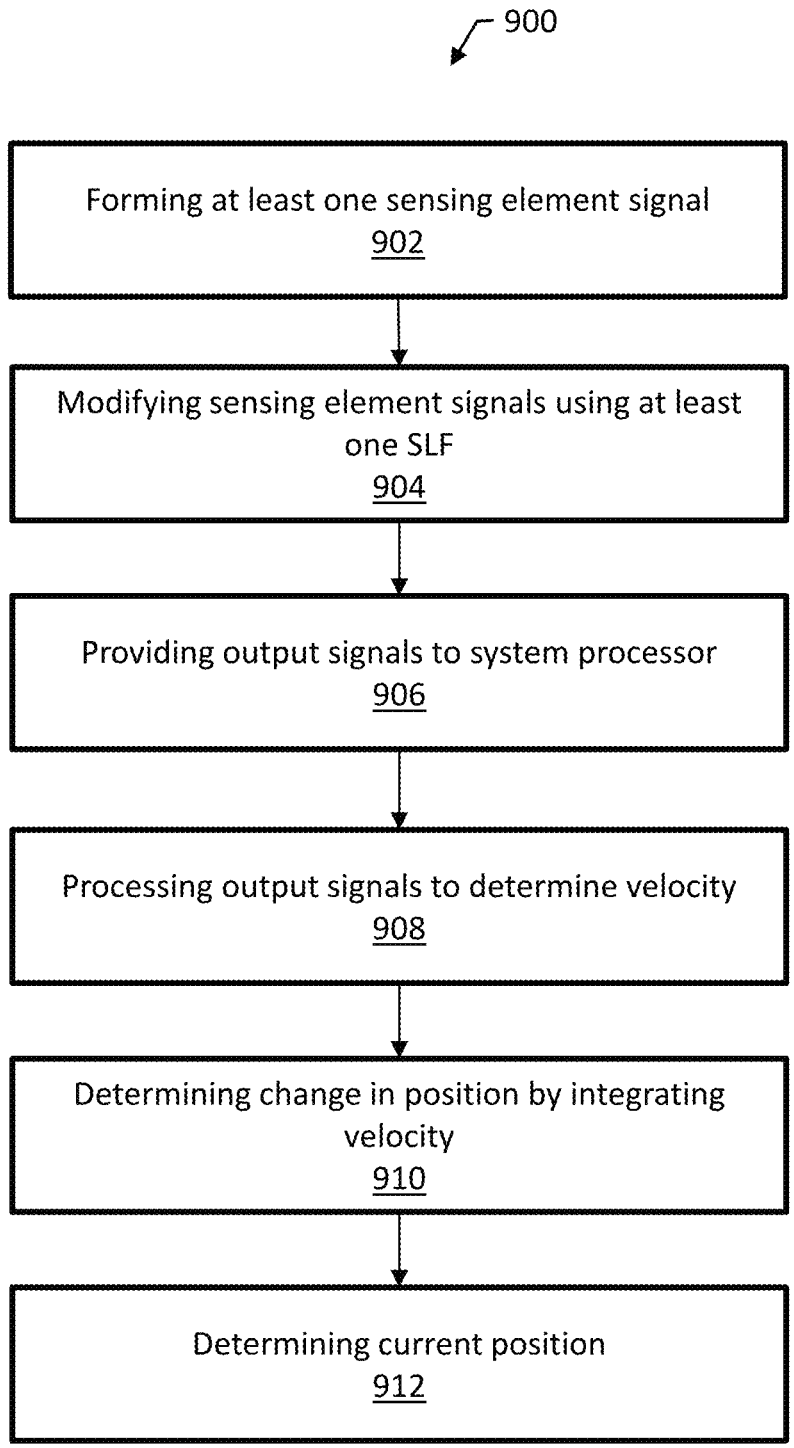
FIG. 9 is a flow diagram of an example method.

FIG. 9 is a flow diagram of an example method 900 for navigating with respect to the Earth's magnetic field or Earth's geography.

The method 900 includes forming at least one sensing element signal by carrying an MVP sensor in a magnetic field (902), modifying sensing element signals using at least one SLF to provide a digital type SLF output signal (904), providing the output signals to the system processor (906), processing the output signals to determine velocity (908), determining change in position by integrating velocity to determine a change in position (910), determining a current position by adding change in position to a prior position (912).

Modifying by the SLF comprises converting sensing element signals to digital type. In some cases, modifying signals includes signal conditioning sensing element signals before converting them to digital form. Conditioning includes at least one of amplifying and frequency selecting. Providing output signals to the processor is providing by electrical or optical conductors.

Determining velocity can comprises normalizing SLF output signals for local magnetic field strength and/or sensing element tilt. Normalizing velocity comprises dividing said SLF output signal by a concurrently detected magnetic field signal. Normalizing for sensing tilt comprising adjusting velocity signal strength to determine velocity over ground. Processing comprises combining a plurality of SLF output signals or plurality of normalized velocity signals to form a velocity vector. Determining velocity and/or position is conducted with respect to at least one of magnetic field and geographic position.

Processing comprises determining and adjusting for orientation of a sensing unit with respect to the local magnetic field for improving sensing element sensor magnitude. Controlling can be conducted by computation or by orienting the sensing unit using passive and/or active gimbal. An illustrative passive gimbal is weighted to maintain orientation with respect to gravity. One type of active gimbal is servo-controlled wherein signals from the magnetometer and/or tilt sensor are provided to the servo rotating the gimbal to orient the sensing unit in a desired direction by feedback method maximizing strength of at least one sensing element signal or by feed-forward method calculating and making an open loop adjustment calculated from the magnetometer and/or tilt signals.

Determining position can include comparing geographic position with GPS provided position. Comparing comprises determining difference in position between geographic position and GPS position. Comparing can further comprise issuing an alarm when this difference exceeds a threshold. In some cases, a GPS position, or position determined by other methods, e.g. RF, celestial or visual triangulation, can be used to compensate for MVP sensor drift.

Determining current position can include comparing current position to a desired position and adjusting navigation to steer a vehicle with respect to desired destination and/or navigation track.

The scope of the present disclosure includes any feature or combination of features disclosed in this specification (either explicitly or implicitly), or any generalization of features disclosed, whether or not such features or generalizations mitigate any or all of the problems described in this specification. Accordingly, new claims may be formulated during prosecution of this application (or an application claiming priority to this application) to any such combination of features.

In particular, with reference to the appended claims, features from dependent claims may be combined with those of the independent claims and features from respective independent claims may be combined in any appropriate manner and not merely in the specific combinations enumerated in the appended claims.

For the purposes of the present disclosure, a current source is any type such as the plus terminal of a battery and a current sink is any type such as the negative terminal of the battery. For the purposes of the present disclosure velocity is intended to encompass unprocessed velocity signals normalized velocity and velocity over ground. Unprocessed velocity signals is intended to encompass sensing element signals and SLF output signals.

What is claimed is:

1. A system comprising:
    at least one sensing unit comprising a sensing element and at least one spatial Lorentz filter (SLF) coupled to the sensing element, the at least one SLF comprising an input and an output, wherein an analog to digital converter (ADC) is connected between the input and the output for providing a digital output signal; and
    wherein the at least one sensing unit is connected to a processor configured for determining a velocity or a position with respect to a magnetic field and/or a geographic position by processing the digital output signal, wherein the processor is configured to process the digital output signal by normalizing the digital output signal using a value for a strength of the magnetic field.

2. The system of claim 1, wherein the at least one sensing unit is of a current-deflection sensing type, wherein the sensing element is connected at a first end to a current source and at a second end to a current sink, wherein the at least one SLF is connected between a first side and a second side of the sensing element for detecting a cross-element potential proportional to a velocity dependent Lorentz force due to coupling of the magnetic field with the sensing element.

3. The system of claim 1, wherein a potential is induced between a first end and a second end of the sensing element by a Lorentz force, wherein the first end is connected to the at least one SLF and the second end is connected to a ground.

4. The system of claim 3, further comprising at least one charge retaining switch coupled to the sensing element at the first end and/or the second end.

5. The system of claim 3, wherein the at least one SLF includes a first SLF and a second SLF, wherein the second end of the first SLF is connected to the second SLF.

6. The system of claim 1, wherein the at least one SLF comprises a signal conditioner connected between the input and the ADC, wherein the signal conditioner comprises a frequency-selector and/or an amplifier.

7. The system of claim 1, wherein an orientation and/or a spatial extent is selected to reduce coupling of the at least one SLF with the magnetic field.

8. The system of claim 1, wherein the at least one SLF includes at least two SLFs, wherein each of the at least two SLFs is electrically grounded.

9. The system of claim 1, wherein the sensing element is formed of a conductor material or a semiconductor material.

10. The system of claim 1, wherein the sensing element comprises a disc, a slab, a deposited layer, or a filament geometry.

11. The system of claim 1, comprising a plurality of non-parallel sensing units comprising an array for measuring the velocity in more than one direction.

12. The system of claim 1, further comprising a magnetometer and/or a tilt sensor connected to the processor and configured for determining and/or compensating for orientation of the system to Earth's magnetic field and/or to Earth's surface.

13. The system of claim 1, further comprising a gimbal configured to adjust an orientation of the at least one sensing unit, wherein the gimbal is passive or active.

14. The system of claim 1, further comprising a position tracking system configured for integrating a measurement of the velocity over time to determine a change in position and updating a previously recorded position with the change in position to determine a current position.

15. The system of claim 1, further comprising a Global Positioning System (GPS) receiver connected to the processor for detecting GPS spoofing by comparing the position determined by the processor and a GPS position determined by the GPS receiver.

16. The system of claim 1, wherein the value for the strength of the magnetic field includes a concurrent measure of the Earth's magnetic field.

17. A method comprising:
    detecting a sensing element signal induced by a spatial Lorentz force with at least sensing unit, wherein the at least one sensing unit comprises a sensing element and at least one spatial Lorentz filter (SLF) coupled to the sensing element, wherein the at least one SLF comprises an input and an output, wherein an analog to digital converter (ADC) is connected between the input and the output;
    providing the sensing element signal to the at least one SLF;
    modifying the sensing element signal by digital conversion to a digital SLF output signal using the ADC; and
    providing the digital SLF output signal to a processor configured to process the digital SLF output signal to determine a velocity or a position with respect to a magnetic field and/or a geographic position, wherein processing the digital SLF output signal comprises normalizing the digital SLF output signal using a value for a strength of the magnetic field.

18. The method of claim 17, wherein modifying the sensing element signal comprises signal conditioning prior to the digital conversion.

19. The method of claim 17, wherein the value for a strength of the magnetic field includes a concurrent measure of the Earth's magnetic field.

20. The method of claim 19, wherein the normalized velocity signal is further normalized for sensor tilt with respect to a direction of gravity.

21. The method of claim 19, wherein the position is determined by integrating the normalized velocity signal over time to determine a change in position and adding the change in position to an initial position to determine an updated position.

22. The method of claim 17, wherein the digital conversion is preceded by signal conditioning comprising amplifying and/or frequency selecting.

* * * * *